(12) United States Patent
Sano

(10) Patent No.: US 6,268,233 B1
(45) Date of Patent: Jul. 31, 2001

(54) PHOTOVOLTAIC DEVICE

(75) Inventor: Masafumi Sano, Soraku-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/232,702

(22) Filed: Jan. 19, 1999

(30) Foreign Application Priority Data

Jan. 26, 1998 (JP) .................................................. 10-012220

(51) Int. Cl.$^7$ .................................................. H01L 21/00
(52) U.S. Cl. .................................. 438/57; 438/96; 438/97
(58) Field of Search .................................. 438/48, 96, 97, 438/57

(56) References Cited

U.S. PATENT DOCUMENTS

| | | | |
|---|---|---|---|
| 2,949,498 | 8/1960 | Jackson | 136/244 |
| 4,400,409 | 8/1983 | Izu et al. | 427/39 |
| 5,336,623 | * 8/1994 | Sichanugrist et al. | 437/4 |
| 5,913,986 | * 6/1999 | Matsuyama | 136/255 |
| 6,025,039 | * 2/2000 | Yajima | 427/573 |

OTHER PUBLICATIONS

K. Miyachi et al., "Fabrication of Single Pin Type Solar Cells With A High Conversion Efficiency of 13.0%," *11th E.C. Photovoltaic Solar Energy Conf.*, (1992) pp. 88–91.

K. Yamamoto et al., "Optical Confinement Effect for below 5μm Thin Film Poly–Si Solar Cell on Glass Substrate," *Jpn. J. Appl. Phys.*, vol. 36 (1997) pp. L569–L572.

\* cited by examiner

*Primary Examiner*—Richard Elms
*Assistant Examiner*—Adam Pyonin
(74) *Attorney, Agent, or Firm*—Fitzpatrick, Cella, Harper & Scinto

(57) ABSTRACT

A method for making a photovoltaic device comprises the steps of depositing a hydrogen-containing n-type silicon semiconductive layer, a hydrogen-containing i-type silicon semiconductive layer, and a hydrogen-containing p-type silicon semiconductive layer, in that order, on a supporting substrate. In the step of depositing the hydrogen-containing n-type silicon semiconductive layer, an n-type amorphous semiconductive layer and then an n-type microcrystalline semiconductive layer are deposited to constitute the hydrogen-containing n-type silicon semiconductive layer. The hydrogen-containing n-type silicon semiconductive layer is annealed. Further, an i-type microcrystalline silicon semiconductive layer as the hydrogen-containing i-type silicon semiconductive layer is formed on the annealed hydrogen-containing n-type silicon semiconductive layer.

5 Claims, 7 Drawing Sheets

PHOTOVOLTAIC DEVICE

BACKGROUND OF THE INVENTION

1. Field of the Invention

The present invention relates to photovoltaic devices, such as solar batteries and sensors. In particular, the present invention relates to a photovoltaic device composed of nip-type silicon semiconductive layers including an i-type microcrystalline semiconductive layer, and a method for making the same.

2. Description of the Related Art

Photovoltaic devices or photoelectric transducers convert solar light energy into electrical energy, and have become widespread as low-power light sources in industrial fields including electronic calculators and wristwatches. Furthermore, photovoltaic devices have attracted attention as feasible electrical sources in place of chemical fuels, such as petroleum and coal.

A photovoltaic device uses photovoltaic conversion in a p-n junction in a semiconductor. Silicon semiconductors absorb solar light to form optical carriers including electrons and positive holes. The optical carriers drift due to the internal electric field at the p-n Junction and are supplied to an external device. Photovoltaic devices are generally produced by processes used in production of general semiconductor devices. A p- or n-type single-crystal silicon is formed by a crystal growth process, such as a Czochralski (CZ) process, and then is sliced to form silicon wafers with a thickness of approximately 300 $\mu$m. A conductive layer is formed on each wafer, in which the wafer and the conductive layer have reverse types to each other, and thus a p-n junction is formed therebetween.

Single-crystal silicon has been primarily used in practical photovoltaic devices in view of reliability and conversion efficiency. Since these photovoltaic devices are produced by semiconductor production processes, their production cost is significantly high.

Single-crystal silicon photovoltaic devices have the following disadvantages. Single-crystal silicon has a low light absorption coefficient due to indirect transition; hence, it must have a thickness of at least 50 $\mu$m in a photovoltaic device in order to achieve sufficient absorption of incident solar light. Single-crystal silicon has a band gap of approximately 1.1 eV, which is narrower than a desired value, 1.5 eV, for the photovoltaic device; hence, it is not capable of effectively using a short-wave region of the incident light.

A reported photovoltaic device using polycrystalline silicon has a surface texture structure, is capable of forming at a low temperature of 550° C. or less, and has superior characteristics for a thickness of 5 $\mu$m or less (Keiji Yamamoto, Akihiko Nakajima et al., "Optical Confinement Effect for below 5-$\mu$m Thin Film Poly-Si Solar Cell on Glass Substrate", Jpn. J. Appl. Phys. Vol. 36 (1997), pp. L569–L572). This photovoltaic device, however, requires a relatively high process temperature and a low process speed, and has not resulted in practical use.

Since single-crystal silicon and polycrystalline silicon are composed of crystal, production of a large wafer is significantly difficult. Furthermore, photovoltaic devices used outdoors require expensive packages to be protected from mechanical damage caused by a variety of weather conditions. Thus, the production cost per unit of generated power is comparatively higher than that in conventional power generation methods.

Achievement of a low-cost, large-area photovoltaic device is an essential technical problem in practical use for generation of electrical power. A variety of studies, such as a search for inexpensive materials and materials with high conversion efficiency have continued for the solution to this problem. Examples of materials for photovoltaic devices include tetrahedral amorphous semiconductors, such as amorphous silicon, amorphous silicon-germanium, and amorphous silicon carbide; Group II–VI compound semiconductors, such as CdS and $CU_2S$; and Group II–V compound semiconductors, such as GaAs and GaAlAs. Among them, amorphous semiconductors are the most promising, since they have the following advantages. A thin-film photovoltaic device using an amorphous semiconductor as a photovoltaic layer allows production of a film having a large area. The thin-film photovoltaic device has a smaller thickness than that of single-crystal or polycrystalline silicon. The thin-film photovoltaic device can be deposited on any substrate material. On the other hand, amorphous semiconductor photovoltaic devices have disadvantages, such as low photovoltaic conversion efficiency and unreliability when they are used for the generation of large amounts of electrical power.

A means for the improvement of photovoltaic conversion efficiency of amorphous semiconductor photovoltaic devices is narrowing the band gap, which can result in increased sensitivity to long-wavelength light. Since amorphous silicon has a band gap of approximately 1.7 eV, it cannot absorb long-wavelength light with a wavelength of greater than 700 nm. Materials having a narrower band gap and thus having sensitivity to long-wavelength light are being studied. A typical material is amorphous silicon-germanium, in which the band gap can be readily varied in a range of approximately 1.3 eV to 1.7 eV by controlling the ratio of silicon material gas to germanium material gas in the film deposition process.

U.S. Pat. No. 2,949,498 discloses a stacked cell of a plurality of photovoltaic devices each having a unit device structure as another means for improving the cell's conversion efficiency. The stacked cell is composed of p-n junction semiconductors and has a technical conception common to amorphous and crystalline semiconductors. That is, individual photovoltaic devices have different band gaps and thus the stacked cell can absorb solar light with high efficiency, resulting in an increased photovoltaic conversion efficiency due to an increased $V_{oc}$.

Stacked cells are designed so that the band gap decreases from the top layer lying at the side of incident solar light to the bottom layer lying at the side away from the incident solar light. The stacked cell can thereby sufficiently absorb all spectrum regions of the solar light, and thus the photovoltaic conversion efficiency is significantly improved (K. Miyauchi et al., Proc. 11th E. C. Photovoltaic Solar Energy Conf. Montreux, Switzerland, 88, 1992; and K. Momoto et al., "a-Si alloy Tree-Stacked solar Cells with High Stabilized-Efficiency II, 7th Photovoltaic Science and Engineering Conf. Nagoya, 275, 1993).

Photovoltaic devices including only i-type amorphous semiconductive layers cause a decrease in conversion efficiency with light irradiation, since amorphous silicon and amorphous silicon-germanium films deteriorate during light irradiation so that transportability of carriers decreases. Since such a phenomenon is not observed in crystalline semiconductors, the phenomenon is inherent in amorphous semiconductors. Such unreliability hinders practical use of amorphous semiconductors in the generation of electrical power.

Microcrystalline silicon semiconductors with i-type layers produced by a plasma enhanced CVD process have attracted attention, in view of the thickness for achieving a sufficient optical current and photo-deterioration (A. Shah, H. Keppner, et al., "INTRINSIC MICROCRYSTALLINE SILICON ($\mu$c-Si:H)—A PROMISING NEW THIN FILM SOLAR CELL MATERIAL", 1994, IEEE First WCPEC, pp. 409–412, Dec. 5–9, 1994, Hawaii; A. Shah, H. Keppner, et al, The "Micromorph" Solar cell: Extending a-Si:H Technology Towards Thin Film Crystalline Silicon, 25th IEEE PV Specialists Conference, Washington, May 13–17, 1996). In these technologies, however, a slow deposition rate of the microcrystalline layer hinders practical use of such semiconductors.

SUMMARY OF THE INVENTION

It is an object of the present invention to provide a photovoltaic device including a microcrystalline semiconductive layer.

It is another object of the present invention to provide a photovoltaic device with a reduced thickness.

It is still another object of the present invention to provide a photovoltaic device having improved conversion efficiency suitable for the generation of electrical power.

It is a further object of the present invention to provide a photovoltaic device having high reliability.

It is a still further object of the present invention to provide a method for making a photovoltaic device capable of depositing a microcrystalline semiconductive layer with a high deposition rate and reduced production cost.

A first aspect of the present invention is a method for making a photovoltaic device comprising the steps of depositing a hydrogen-containing n-type silicon semiconductive layer, a hydrogen-containing i-type silicon semiconductive layer, and a hydrogen-containing p-type silicon semiconductive layer, in that order, on a supporting substrate, wherein in the step of depositing the hydrogen-containing n-type silicon semiconductive layer, at least an n-type amorphous semiconductive layer and then an n-type microcrystalline semiconductive layer are deposited to constitute the hydrogen-containing n-type silicon semiconductive layer, the hydrogen-containing n-type silicon semiconductive layer is annealed, and an i-type microcrystalline silicon semiconductive layer as the hydrogen-containing i-type silicon semiconductive layer is formed on the annealed hydrogen-containing n-type silicon semiconductive layer.

A second aspect of the present invention is a photovoltaic device comprising a hydrogen-containing n-type silicon semiconductive layer, a hydrogen-containing i-type microcrystalline silicon semiconductive layer, and a hydrogen-containing p-type silicon semiconductive layer deposited in that order, on a supporting substrate, wherein the hydrogen-containing n-type silicon semiconductive layer comprises an n-type amorphous semiconductive layer and an n-type microcrystalline semiconductive layer, the n-type amorphous semiconductive layer and the n-type microcrystalline semiconductive layer being annealed.

Preferably, the hydrogen-containing n-type silicon semiconductive layer is annealed under a condition such that the hydrogen-containing n-type silicon semiconductive layer becomes a crystal nucleus-forming layer. Preferably, the hydrogen-containing n-type silicon semiconductive layer is annealed at a temperature of 550° C. or less.

Preferably, at least a first transparent conductive layer is formed on the supporting substrate. Preferably, a second transparent conductive layer is formed on the hydrogen-containing p-type silicon semiconductive layer.

Preferably, the hydrogen-containing i-type microcrystalline silicon semiconductive layer is formed by a plasma enhanced CVD process using a silane material gas diluted into a concentration of 1/20 or less with a diluent gas comprising hydrogen or a mixture of hydrogen and an inert gas, under the conditions of a deposition pressure of 400 mtorr or less, a retention time of the silane material gas in a deposition chamber of 40 msec or less, and a radiofrequency wave of 0.1 GHz to 10 GHz.

Preferably, the thickness of the hydrogen-containing n-type amorphous silicon semiconductive layer is in a range of 50 Å to 1,000 Å.

Preferably, the thickness of the hydrogen-containing n-type microcrystalline silicon semiconductive layer is in a range of 50 Å to 1,000 Å.

DESCRIPTION OF THE PREFERRED EMBODIMENTS

Figure 1:
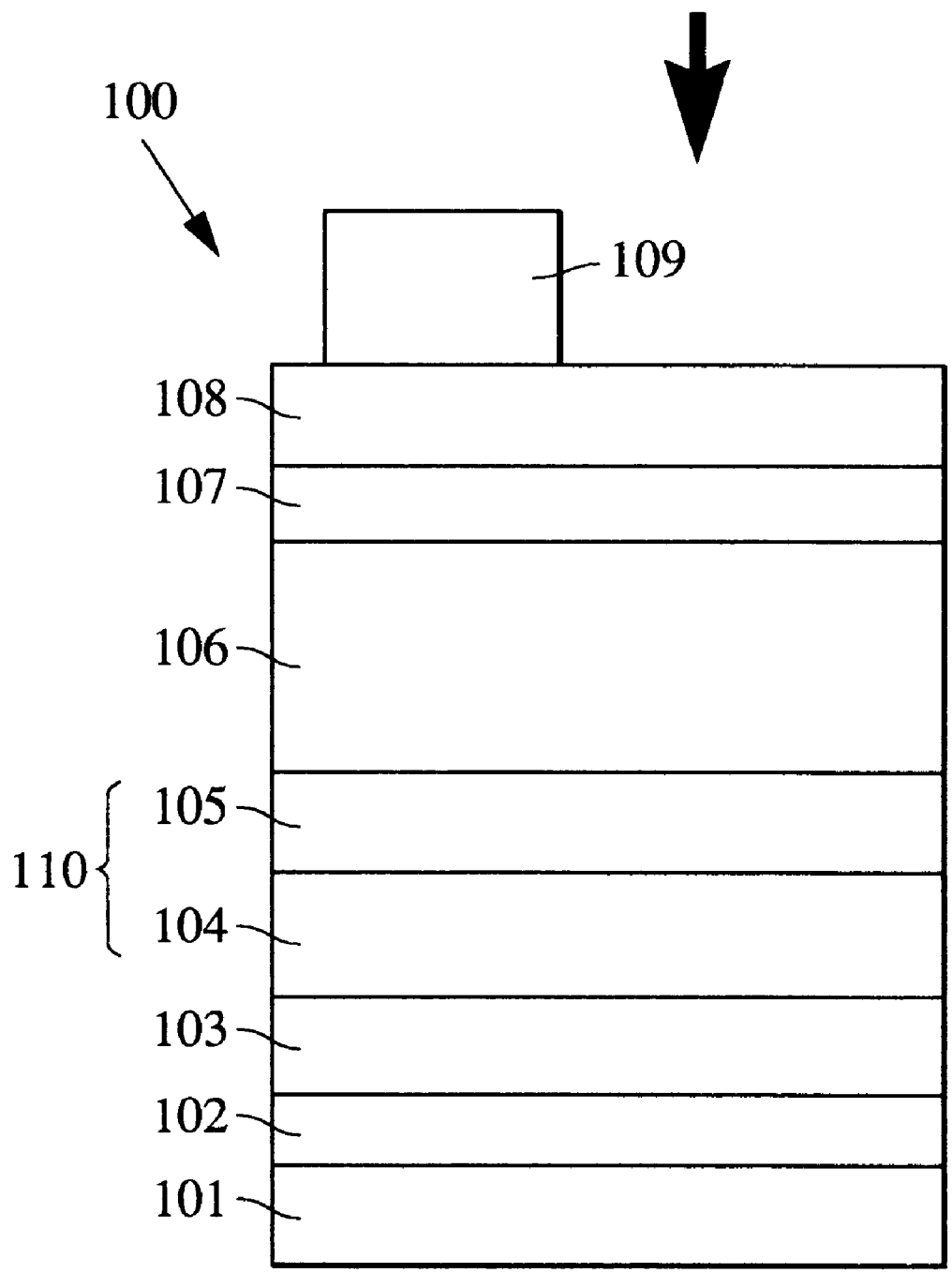
FIG. 1 is a schematic cross-sectional view of a photovoltaic device as an embodiment in accordance with the present invention.

A photovoltaic device in accordance with the present invention comprises a hydrogen-containing n-type silicon semiconductive layer, a hydrogen-containing i-type microcrystalline silicon semiconductive layer, and a hydrogen-containing p-type silicon semiconductive layer deposited in that order, on a supporting substrate.

In the present invention, the n-type silicon semiconductive layer is annealed to form a crystal nucleus-forming layer. The i-type microcrystalline silicon semiconductive layer with a small thickness is deposited on the crystal nucleus-forming layer at a high deposition rate. Since the resulting i-type microcrystalline silicon semiconductive layer has a desired particle size and a relatively high crystallinity, it does not substantially show photo-deterioration. Consequently, the photovoltaic device has high photovoltaic conversion efficiency regardless of a small thickness. Furthermore, a high deposition rate enables a reduction in process costs of photovoltaic devices.

The n-type amorphous silicon semiconductive layer may be deposited on a first transparent conductive layer formed on the supporting substrate. The n-type amorphous silicon semiconductive layer has high adhesiveness to the first transparent conductive layer and protects the transparent conductive layer from reduction due to hydrogen plasma. Furthermore, the n-type microcrystalline silicon semiconductive layer can be deposited with high reproducibility and contains relatively uniform crystal grains due to suppressed abnormal crystal growth.

The n-type microcrystalline silicon semiconductive layer also functions as crystal nuclei that help crystal growth in the microcrystalline silicon layer during annealing of the n-type silicon semiconductive layer at a low temperature of 550° C. or less for a short time.

Deposition conditions of the i-type microcrystalline silicon semiconductive layer are controlled, so that the crystal nucleus-forming layer readily affects low-temperature, high-speed deposition of the i-type microcrystalline silicon semiconauctive layer. When a large amount of precursor of the i-type microcrystalline silicon semiconductive layer is supplied, the resulting i-type microcrystalline silicon semiconductive layer has reduced defects, including dangling bonds, regardless of high-speed deposition, and thus has high photovoltaic conversion efficiency.

Since the annealing temperature is set to be 550° C. or less, the difference in the surface state between the i-type microcrystalline silicon semiconductive layer and the p-type silicon semiconductive layer thereon is reduced and the grain boundaries in the i-type layer are improved. Thus, compatibility of high photovoltaic conversion efficiency with suppressed photo-deterioration can be achieved.

The thickness of the n-type amorphous silicon semiconductive layer readily controls the volume fraction and grain size of microcrystals in the n-type microcrystalline silicon semiconductive layer. Furthermore, a desired thickness suppresses damage of the first transparent conductive layer by plasma, and improves the above-mentioned adhesiveness. Thus, a photovoltaic device having a large area and high photovoltaic conversion efficiency can be formed.

A desired thickness of the n-type microcrystalline silicon semiconductive layer assures functions of this layer as a low-resistance, n-type semiconductive layer and as a crystal nucleus-forming layer when the i-type microcrystalline silicon semiconductive layer is deposited. Thus, a desired thickness ensures high-speed deposition of the i-type microcrystalline silicon semiconductive layer, and controls the crystal grain size and crystallinity in the i-type microcrystalline silicon semiconductive layer. Accordingly, the photovoltaic device can maintain high photovoltaic conversion after long-term light irradiation.

When the thickness of the i-type microcrystalline silicon semiconductive layer is significantly reduced from the preferred thickness of a conventional layer, an increase in the localization state in the i-type layer during light irradiation can be suppressed. Thus, optical degradation of the photovoltaic device can be further suppressed.

The preferred embodiments of the photovoltaic device in accordance with the present invention will now be described in detail with reference to the attached drawings.

FIG. 1 is a schematic cross-sectional view of a photovoltaic device as an embodiment in accordance with the present invention. A photovoltaic device 100 comprises a supporting substrate 101, a first transparent conductive layer 103, an n-type amorphous semiconductive layer 104, an n-type microcrystalline semiconductive layer 105, an i-type microcrystalline semiconductive layer 106, a p-type semiconductive layer 107, a second transparent conductive layer 108, and a collecting electrode 109. A back reflection layer 102 may be provided between the supporting substrate 101 and the first transparent conductive layer 103, if necessary, as shown in FIG. 1. The i-type microcrystalline semiconductive layer 106 is formed after annealing the n-type amorphous semiconductive layer 104 and the n-type microcrystalline semiconductive layer 105 to form a crystal nucleus-forming layer 110.

(Supporting Substrate)

Since each of the semiconductive layers 104 to 107 has a thickness of at most 3.5 $\mu$m, these layers may be deposited on any suitable supporting substrate 101. The supporting substrate 101 may be of single-crystal or non-single-crystal type. The supporting substrate 101 may be conductive or nonconductive. In addition, the supporting substrate 101 may be transparent or nontransparent. Preferred supporting substrates have reduced deformation and distortion, and required strength. Examples of supporting substrates include thin films and composite thin films of metals, e.g., iron, nickel, chromium, aluminum, molybdenum, gold, niobium, tantalum, vanadium, titanium, platinum, and lead, and alloys thereof, e.g., bronze and stainless steel; heat-resistant synthetic resin films and sheets of polyesters, polyethylene, polycarbonates, cellulose acetate, polypropylene, polyvinyl chloride, polyvinylidene chloride, polystyrene, polyamides, polyimides, and epoxys; composite films of these resins with glass fiber, carbon fiber, boron fiber or metal fiber; composite films of these metals and resins with metal thin films different from the base metal films and insulating thin films, e.g. $SiO_2$, $Si_3N_4$, $Al_2O_3$, and AlN, formed thereon by a sputtering, vapor deposition, or plating process; and glass and ceramic.

When the supporting substrate 101 is composed of a conductive material such as metal, the supporting substrate 101 can also function as an extract electrode. When the supporting substrate 101 is composed of an insulating material such as a synthetic resin, it is preferable that an extract electrode for extracting a current be provided on the front surface (for forming the films) of the supporting substrate 101. Examples of materials for the extract electrode include metals, e.g. aluminum, gold, platinum, silver, nickel, titanium, molybdenum, tungsten, iron, vanadium, chromium, and copper; alloys, e.g. stainless steel, bronze, and nichrome; and transparent conductive oxides (TCOs), e.g. $SnO_2$, $In_2O_3$, ZnO, and indium-tin oxide. The extract electrode may be formed by a plating, vapor deposition or sputtering process. The extract electrode also functions as a back reflection layer or a first transparent conductive layer, as will be described below.

The supporting substrate 101 may have a smooth surface or a finely uneven surface. The cross-sectional shape of the finely uneven surface may be spherical, conical, or pyramidal. It is preferable that the maximum height ($R_{max}$) of the uneven surface be in a range of 0.05 μm to 2 μm in order to result in an increase in the optical path due to random reflection of the incident light. The shape of the supporting substrate may be planar, long belt, or cylindrical in response to its use. The thickness of the supporting substrate may be determined according to demand. For example, the thickness is reduced as much as possible when a flexible photovoltaic device is required or when light is incident on the back surface of the substrate. The thickness is generally 10 μm or more in consideration of ready production and handling, and mechanical strength of the substrate.

(Back Reflection Layer)

The back reflection layer 102 reflects the incident light, which is not absorbed in the semiconductive layers, towards the semiconductive layers. The back reflection layer 102 in the present invention may function as a back electrode in some cases. Examples of materials for the back reflection layer 102 include metals, e.g. gold, silver, copper, aluminum, nickel, iron, chromium, molybdenum, tungsten, titanium, cobalt, tantalum, niobium, and zirconium; and alloys, e.g. stainless steel. Among them, high-reflectance metals, such as aluminum, copper, silver, and gold are preferable. Although the surface of the back reflection layer 102 may be flat, an uneven surface is preferred to achieve random scattering of the incident light. The random scattering causes an increase in the optical path of long-wavelength light not absorbed in the semiconductive layers. Such an improvement in long-wavelength sensitivity results in a large short-circuiting current in the photovoltaic device and thus improved photovoltaic conversion efficiency. The surface roughness is preferably represented by a maximum difference $R_{ma}$ between the peak and bottom of the unevenness in a range of 0.2 μm to 2.0 μm. When the supporting substrate 101 functions as a back electrode, the back reflection layer 102 is not always necessary.

The back reflection layer 102 may be formed by a vapor deposition, sputtering, plating, or printing process. The surface roughness of the back reflection layer 102 may be formed by subjecting this layer to a dry etching, wet etching, sand blasting, or heating process. Alternatively, the surface roughness may be formed by depositing a metal or alloy onto a heated substrate.

(Transparent Conductive Layer)

The first transparent conductive layer 103 provided between the back reflection layer 102 and the n-type amorphous semiconductive layer 104 is composed of, for example, conductive zinc oxide. The first transparent conductive layer 103 prevents diffusion of the metal constituent in the back reflection layer 102 into the n-type amorphous semiconductive layer 104. The first transparent conductive layer 103 having slight resistance also prevents short-circuiting between the back reflection layer 102 (may function as an electrode) and the second transparent conductive layer 108 caused by defects, such as pinholes, in the semiconductive layers. Other functions of the first transparent conductive layer 103 are confinement of the incident light in the photovoltaic device due to multiple interference in the thin films.

Although the surface of the first transparent conductive layer 103 may be flat, it is preferably uneven in view of scattering of the incident light. The uneven surface of the first transparent conductive layer 103 scatters the long-wavelength light not absorbed in the semiconductive layers to increase the optical path of the incident light in the semiconductive layers. Thus, the photovoltaic device has improved long-wavelength sensitivity, an increased short-circuiting current, and thus improved photovoltaic conversion efficiency. A preferred surface roughness represented by the maximum difference $R_{max}$ between the peak and bottom of the unevenness is in a range of 0.2 μm to 2.0 μm.

The first transparent conductive layer 103 may be formed by a vapor deposition, sputtering, plating or printing process. The surface roughness of the first transparent conductive layer 103 may be formed by subjecting this layer to a dry etching, wet etching, sand blasting, or heating process. Alternatively, the surface roughness may be formed by depositing the first transparent conductive layer 103 onto a heated substrate. An effective wet etching process is performed in an acidic or alkaline solution; however, the wet etching process controls the surface unevenness with great difficulty. The temperature of the etchant solution and the dipping time are important factors that determine the shape of the unevenness. Examples of acids used include formic acid, acetic acid, hydrochloric acid, and nitric acid. Examples of alkalis include potassium hydroxide, sodium hydroxide, and aluminum hydroxide. Examples of usable salts in the wet etching include iron chloride, aluminum chloride, and aluminum sulfate. A solution containing acetic acid and a salt such as aluminum sulfate can relatively stably control the unevenness. The control of the surface unevenness will be more readily performed when the temperature of the solution is set to be low, although it depends on the etchant concentration.

(n-type Amorphous Semiconductive Layer, n-type Microcrystalline Semiconductive Layer, p-type Semiconductive Layer)

The n-type amorphous semiconductive layer 104, the n-type microcrystalline semiconductive layer 105, and the p-type semiconductive layer 107 are important layers which determine the photovoltaic characteristics of the device. These semiconductive layers are composed of hydrogen-containing silicon-based semiconductors.

Examples of amorphous (hereinafter "a-"), microcrystalline (hereinafter "μc"), and polycrystalline (hereinafter "poly-c") silicon-based semiconductors for the p-type and n-type semiconductive layers include a-Si:H, a-Si:HX, a-SiC:H, a-SiC:HX, a-SiGe:H, a-SiGeC:H, a-SiO:H, a-SiN:H, a-SiON:HX, a-SiOCN:HX, μc-Si:H, μc-SiC:H, μc-Si:HX, μc-SiC:HX, μc-SiGe:H, μc-SiO:H, μc-SiGeC:H, μc-SiN:H, μc-SiON:HX, μc-SiOCN:HX, poly-Si:H, poly-Si:HX, poly-SiC:H, poly-SiC:HX, poly-SiGe:H, poly-Si, poly-SiC, and poly-SiGe, wherein X represents halogen. These silicon-based semiconductors are doped with a high concentration of a p-type or n-type valence bond controlling agent. Examples of p-type valence bond controlling agents include Group III elements in the Periodic Table, e.g. B, Al, Ga, In and Tl. Examples of n-type valence bond controlling agents include Group V elements in the Periodic Table, e.g. P, As, Sb and Bi.

Preferably, the p-type semiconductive layer at the side of the incident light is composed of a crystalline semiconductive layer with low light absorbance or an amorphous semiconductive layer having a wide band gap. The concentration of the Group III element in the p-type layer and the concentration of the Group V element in the n-type layer are preferably in a range of 0.1 to 50 atomic percent.

Hydrogen and halogen atoms contained in the p-type or the n-type compensate unbonded sites in the p-type or n-type layer and thus improve doping effects in these layers. The content of hydrogen and/or halogen in the p- or n-type layer is preferably in a range of 0.1 to 40 atomic percent. In the n-type microcrystalline semiconductive layer and the p-type semiconductive layer, the content of hydrogen and/or halogen is preferably in a range of 0.1 to 8 atomic percent. In a preferred embodiment, the content of hydrogen and/or halogen is higher at interfaces between the p-type layer and the i-type layer and between the n-type layer and the i-type layer compared with other regions. A preferred hydrogen and/or halogen content near the interfaces is 1.05 to 2 times the average content in these layers. Enrichment of hydrogen and/or halogen near the interfaces results in a reduced defects and decreased mechanical distortion near the interfaces. Accordingly, the photovoltaic device has a high photoelectromotive force and a high optical current.

In the present invention, annealing of the n-type semiconductive layers 104 and 105 causes an increase in crystal grain size and crystallinity in these layers. These layers function as a crystal nucleus-forming layer 110. The i-type microcrystalline semiconductive layer 106 formed on the crystal nucleus-forming layer 110 can have a desired crystal grain size and a desired crystallinity even when the layer 106 is rapidly deposited. Consequently, the photovoltaic device in accordance with the present invention has a high photoelectromotive force and a high optical current.

Regarding electrical characteristics of the p-type and n-type semiconductive layers in the photovoltaic device, the activation energy is preferably 0.2 eV or less, and more preferably 0.1 eV or less, and the specific resistance is preferably 100 Ω or less, and more preferably 1 Ω or less.

The thickness of the p-type semiconductive layer 107 is in a range of preferably 1 nm to 50 nm, and more preferably 3 nm to 10 nm. The thickness of the n-type amorphous semiconductive layer 104 is in a range of preferably 50 Å to 1,000 Å, and more preferably 100 Å to 700 Å. When the thickness is lower than 50 Å, the first transparent conductive layer 103 will not sufficiently be protected from plasma damage, and thus light reflectance and adhesiveness will be worsened. When the thickness is higher than 1,000 Å, the series resistance of the photovoltaic device will increase and the light reflectance will decrease. Furthermore, the volume fraction of microcrystal in the n-type microcrystalline semiconductive layer 105 will increase. Consequently, the device will have inferior photovoltaic characteristics.

The thickness of the n-type microcrystalline semiconductive layer 105 is preferably in a range of 50 Å to 1,000 Å. At a thickness of less than 50 Å, the crystal nucleus-forming layer will barely be formed at a low temperature of 550° C. or less. Thus, the crystal grain size and crystallinity of the i-type microcrystalline semiconductive layer 106 will decrease. A thickness of higher than 1,000 Å causes an increase in series resistance and a decrease in light reflectance in the photovoltaic device. Furthermore, the n-type microcrystalline semiconductive layer 105 will have a nonuniform distribution of the crystal grain size, resulting in abnormal crystal growth in the i-type microcrystalline semiconductive layer 106. Thus, the resulting device will have inferior photovoltaic characteristics.

The annealing temperature for forming the crystal nucleus-forming layer 110 is in a range of preferably 550° C. or less, and more preferably 350° C. to 500° C. The annealing may be performed by any process. Examples of annealing processes include lamp annealing, laser annealing, and annealing with a sheath heater. The annealing may be performed in a vacuum, an inert gas atmosphere (Ar, He or Ne), a hydrogen atmosphere, or a mixture of these gases.

(i-type Microcrystalline Semiconductive Layer)

The i-type microcrystalline semiconductive layer 106 used for the p-i-n junction is an important layer that generates and transports carriers by light irradiation. The i-type microcrystalline semiconductive layer 106 may be slightly p-doped or n-doped.

Preferred semiconductors for the i-type microcrystalline semiconductive layer 106 are microcrystalline silicon semiconductors. The microcrystalline silicon semiconductors are represented by the following formulae: $\mu$c-Si:H, $\mu$c-Si:F, $\mu$c-Si:H:F, and the like, wherein H and F are elements for compensating dangling bonds.

A preferred i-type microcrystalline semiconductive layer 106 in the present invention is an i-type hydrogenated microcrystalline silicon ($\mu$c-Si:H) layer. Preferable characteristics of this layer are as follows: absorption factor ($\alpha$): 5,000 cm$^{-1}$ or more for 630 nm light; hydrogen content ($C_H$): 1% to 10%; photoconductivity ($\rho_p$): $1.0 \times 10^{-5}$ S/cm or more when irradiated with pseudo-solar light of AM-1.5 (100 W/cm$^2$); dark photoconductivity ($\rho_d$): $1.0 \times 1.0^{-6}$ S/cm or less; Urbach energy by a constant photocurrent method: 55 meV or less; X-ray diffraction pattern: predominant orientation in the (110) direction; and crystal grain size: 100 nm or less. The above-mentioned microcrystalline semiconductors used for the p-type or n-type semiconductive layers may also be used for the i-type microcrystalline semiconductive layer.

The thickness of the i-type microcrystalline semiconductive layer 106 is in a range of preferably 0.5 $\mu$m to 3.5 $\mu$m, and more preferably 0.8 $\mu$m to 3.0 $\mu$m. The crystal grain size and the crystallinity in the layer will decrease at a thickness of less than 0.5 $\mu$m, resulting in a decrease in a short-circuit current of the photovoltaic device. When the thickness is greater than 3.5 m, the photovoltaic device is sensitive to, and affected by, a significantly small quantity of defects and the surface state, and thus the short-circuit current and the fill factor of the photovoltaic device will decrease. Another advantage of a thinner i-type microcrystalline semiconductive layer 106 is a low operational cost.

(Method for Making Semiconductive Layers)

A preferred process for making the semiconductive layers in the photovoltaic device in accordance with the present invention is a plasma enhanced CVD process using a radiofrequency wave (VHF wave or microwave) of 0.1 to 10 GHz. Another preferred process is a plasma enhanced CVD process using a radiofrequency wave (RF wave or VHF wave) of 0.1 MHz to 0.1 GHz.

In the plasma enhanced CVD process using a radiofrequency wave of 0.1 GHz to 10 GHz, material gases and a diluent gas are introduced into a vacuum deposition chamber while the vacuum chamber is evacuated through a vacuum pump to maintain a constant vacuum pressure. A micro or VHF wave of 0.1 GHz to 100 GHz generated by a microwave or VHF wave oscillator is introduced into the vacuum deposition chamber from a waveguide or a coaxial tube via an inductive window of alumina or a conductor (a nickel, tungsten or stainless steel rod) insulated from the deposition chamber to generate plasma of the material gases. A desired film is thereby deposited onto a substrate placed in the deposition chamber. This method enables the deposition of a film suitable for a photovoltaic device under a variety of conditions.

In the plasma enhanced CVD process using a radiofrequency wave of 0.1 GHz to 10 GHz, the substrate temperature in the deposition chamber lies preferably in a range of 170° C. to 400° C., the internal pressure lies preferably in a range of 5 to 500 mtorr, and the power of the microwave or VHF wave lies preferably in a range of 0.005 to 1 W/cm$^3$. On the other hand, in the plasma enhanced CVD process using a radiofrequency wave of 0.1 MHz to 0.1 GHz, the substrate temperature in the deposition chamber lies preferably in a range of 100° C. to 350° C., the internal pressure lies preferably In a range of 0.1 to 10 mtorr, the RF power lies preferably in a range of 0.01 to 5.0 W/cm$^2$, and the deposition rate lies preferably in a range of 0.1 to 15 Å/sec.

In the plasma enhanced CVD process in accordance with the present invention, the i-type microcrystalline semiconductive layer 106 is preferably formed using a silane material gas diluted to a concentration of 1/20 or less with a diluent gas comprising hydrogen or a mixture of hydrogen and an inert gas, under the conditions of a deposition pressure of 400 mtorr or less, a retention time of the silane material gas in the deposition chamber of 40 msec or less, and a radiofrequency wave of 0.1 GHz to 10 GHz. In the process, the surface of the crystal nucleus-forming layer 110 is cleaned with a large amount of diluent gas, promoting the formation of the i-type microcrystalline semiconductive layer 106. A pressure of 400 mtorr or less suppresses vapor-phase reaction of precursors for the i-type microcrystalline semiconductive layer 106, resulting in high-rate deposition. When the pressure is higher than 400 mtorr, vapor-phase reaction of the precursors proceeds and thus the resulting i-type microcrystalline semiconductive layer 106 will have low film quality. When the pressure is excessively high, microcrystal will barely form and thus the i-type semiconductive layer will be amorphous.

Dilution of the silane gas with a diluent gas to a concentration of 1/20 or less suppresses vapor-phase reaction of precursors for the i-type microcrystalline semiconductive layer 106 and formation of a low-quality i-type microcrystalline semiconductive layer 106 during high-rate deposition. When the silane gas is not sufficiently diluted, the vapor-phase reaction of the precursors proceeds to cause formation of a low-quality i-type microcrystalline semiconductive layer 106. When the silane gas is excessively diluted, the i-type semiconductive layer 106 will not be crystallized and thus will be amorphous.

The retention time of the material gas in the deposition chamber is set to be 40 msec or less to supply a large amount of precursors for the i-type microcrystalline semiconductive layer 106 in a short time. Thus, the resulting i-type microcrystalline semiconductive layer 106 has reduced defects such as dangling bonds regardless of high-rate deposition. A retention time over 40 msec results in a decrease in quality of the i-type microcrystalline semiconductive layer 106 in the high-rate deposition.

A radiofrequency wave of 0.1 GHz to 10 GHz ensures decomposition of the material gases and decomposition and activation of the diluent gas under the above-mentioned conditions. Thus, large amounts of precursors are supplied in a short time and the resulting i-type microcrystalline semiconductive layer 106 has reduced defects such as dangling bonds.

The formation of the i-type microcrystalline semiconductive layer 106 under the above-specified conditions permits high-rate deposition of the i-type microcrystalline semiconductive layer 106 having high photovoltaic conversion efficiency without photo-deterioration. Accordingly, operational costs can be significantly decreased, resulting in mass production of the photovoltaic devices.

A roll-to-roll process disclosed in U.S. Pat. No. 4,400,409 is also useful as a method for depositing the semiconductor layers of the photovoltaic device in accordance with the present invention. In the roll-to-roll process, a long ribbon substrate passes through a plurality of glow discharging regions to continuously deposit required semiconductive layers on the substrate in these regions. This process allows continuous production of photovoltaic devices having a desired semiconductive junction.

(Second Transparent Conductive Layer)

The second transparent conductive layer 108 with an optimized thickness functions as an electrode at the side of the incident light and as an antireflection film. The second transparent conductive layer 108 must have high transmittance for light of a wavelength region absorbed in the semiconductive layers, and low resistance. The transmittance at 550 nm is preferably 80% or more, and more preferably 85% or more. The resistance is preferably $5\times10^{-3}$ Ωcm or less, and more preferably $1\times10^{-3}$ Ωcm or less. Example of materials suitable for the second transparent conductive layer 108 include conductive oxides, such as $In_2O_3$, $SnO_2$, ITO ($In_2O_3+SnO_2$), ZnO, CdO, $Cd_2SnO_4$, $TiO_2$, $Ta_2O_5$, $Bi_2O_3$, $MoO_3$, and $Na_xWO_3$; and mixtures thereof. These materials may contain a dopant for varying the conductivity. Examples of the dopants include Al, In, B, Ga, Si, and F for a ZnO layer; Sn, F, Te, Ti, Sb, and Pb for an $In_2O_3$ layer, or F. Sn, P, As, In, Ti, Te, W, Cl, Br, and I for an $SnO_2$ layer.

The second transparent conductive layer 108 may preferably be formed by a sputtering, resistance heating evaporation, or electron beam evaporation system.

(Collecting Electrode)

The collecting electrode 109 in the present invention is formed on a part of the second transparent conductive layer 108 when the second transparent conductive layer 108 as the electrode at the incident side does not have sufficiently low resistivity. The resistivity of the electrode and thus the series resistance of the photovoltaic device are thereby decreased. Examples of materials suitable for the collecting electrode 109 include metals, e.g. Au, Ag, Cu, Al, Ni, Fe, Cr, Mo, W, Ti, Co, Ta, Nb, and Zr; alloys, e.g. stainless steel; and conductive pastes containing powdered metals. The collecting electrode is preferably silted so that the incident light sufficiently enters the semiconductive layers. The percentage of the area of the collecting electrode 109 to the total area of the incident face of the photovoltaic device is preferably 15% or less, and more preferably 10% or less. The collecting electrode 109 may be formed by an evaporation, sputtering or plating process using a mask, a printing process, or a bonding process of a wire electrode.

A photoelectromotive apparatus with a desired output voltage and a desired output current is formed of the photovoltaic devices in accordance with the present invention. Preferably, the photovoltaic devices are connected to each other in series or parallel, protective layers are provided on the front and rear surfaces, and extract electrodes for extracting electrical power are provided. A diode for preventing a reverse current is preferably assembled when the photovoltaic devices are connected to each other in series.

EXAMPLE 1

Figure 2:
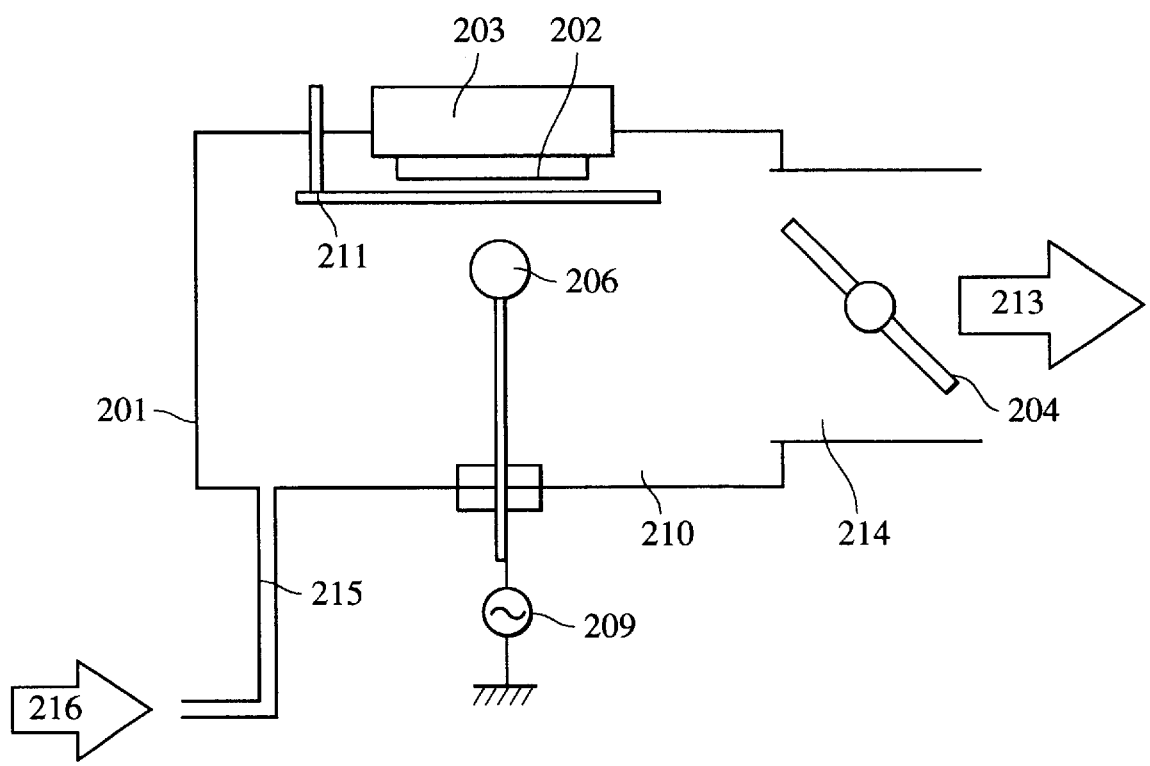
FIG. 2 is a schematic cross-sectional view of a plasma enhanced CVD system for producing a photovoltaic device in accordance with the present invention.

With reference to FIG. 1, a back reflection layer 102 and a first transparent conductive layer 103 were deposited onto a supporting substrate 101 using a deposition system (not shown in the drawing), and then semiconductive layers were deposited thereon using a deposition system shown in FIG. 2 to form a photovoltaic device having the configuration shown in FIG. 1.

The supporting substrate 101 was first prepared. A square stainless steel SUS304 substrate with a thickness of 1.1 mm and sides of 50 mm was subjected to ultrasonic cleaning in a mixture of acetone and isopropyl alcohol, and dried in an air stream. A silver back reflection layer 102 with a thickness of 500 nm was formed at room temperature in a sputtering system not shown in the drawing, and then a ZnO first transparent conductive layer 103 with a thickness of 2 μm was formed thereon at a substrate temperature of 200° C. in a sputtering system not shown in the drawing.

FIG. 2 is a schematic cross-sectional view of a plasma enhanced CVD system for producing photovoltaic devices in accordance with the present invention. The plasma enhanced CVD system includes a reaction or deposition chamber 201, a heater 203, a conductance valve 204, a radiofrequency wave introducer 206, a radiofrequency electrical source 209 including a matching circuit, a movable shutter 211 for shielding a substrate from plasma 210, an exhaust pipe 214, and a gas inlet pipe 215. In the system, the atmosphere in the chamber is evacuated through the exhaust pipe 214 in the direction of an arrow 213, whereas gas is introduced through the gas inlet pipe 215 in the direction of an arrow 216. Although not shown in the drawing, the exhaust pipe is connected to a vacuum pump and the gas inlet pipe 215 is connected to material gas supply units including material gas cylinders. Gases in the material gas cylinders are highly purified. In Example 1, $SiH_4$, $SiF_4$, $PH_3/H_2$ ($PH_3$ content: 1%), $B_2H_6/H_2$ ($B_2H_6$ content: 1%), and $H_2$ were introduced from the gas inlet pipe 215.

The substrate 202 was fixed onto the heater 203 in the reaction chamber 201 and then the reaction chamber 201 was evacuated to a pressure of $1 \times 10^{-5}$ torr or less by an oil diffusion pump. Next, hydrogen ($H_2$)gas (may be replaced with helium gas) was introduced into the reaction chamber 201 while heating the substrate 202 with the heater 203 to a predetermined temperature. Material gases were introduced from the gas inlet pipe 215 while a radiofrequency electrical power was introduced into the reaction chamber 201 through the radiofrequency power source 209. After plasma was generated, the conductance valve 204 was moved to maintain the reaction chamber 201 to a constant pressure, and the matching circuit was adjusted to minimize the reflecting electrical power.

Next, the shutter 211 was opened. When the deposited layer reached a predetermined thickness, the shutter 211 was closed and the introduction of the radiofrequency power source and the material gases were suspended to prepare for the formation of the next layer.

Using the plasma enhanced CVD system, an n-type amorphous semiconductive layer 104 and then an n-type microcrystalline semiconductive layer 105 were formed on the first transparent conductive layer 103 in RF plasma and VHF plasma, respectively, and the substrate 202 was annealed at a temperature of 480° C. by controlling the heater 202 in a hydrogen ($H_2$) atmosphere to form a crystal nucleus-forming layer 110. Next, an i-type microcrystalline semiconductive layer 106 and then a p-type semiconductive layer 107 were deposited thereon in VHF plasma and RF plasma, respectively.

(Formation of n-type Amorphous Semiconductive Layer)

Hydrogen gas of 30 sccm was introduced into the reaction chamber 201. When the pressure in the reaction chamber 201 was stabilized at 1.1 torr and when the temperature of the substrate 202 was stabilized at 250° C., 4 sccm of $SiH_4$ gas, 2 sccm of $PH_3/H_2$ gas, and 100 sccm of $H_2$ gas were introduced so that the pressure in the reaction chamber 201 became 1.1 torr. A RF power source of 13.56 MHz was used as the radiofrequency power source 209. RF power of 5W was applied to the radiofrequency wave introducer (RF electrode) 206 to generate plasma 210, while the shutter 211 was opened to start deposition of the n-type amorphous semiconductive layer 104 on the ZnO first transparent conductive layer 103. When the thickness of the layer reached 15 nm, the shutter 211 was closed and supply of the RF electrical source 206 was suspended to quench the plasma 210. Supply of $SiH_4$ gas and $PH_3/H_2$ gas was suspended, whereas supply of hydrogen gas was continued for 2 minutes. The supply of hydrogen gas was also suspended, and then the reaction chamber 201 and the pipes 214 and 215 were evacuated to a pressure of $1 \times 10^{-5}$ torr.

(Formation of n-type Microcrystalline Semiconductive Layer)

Next, 30 sccm of hydrogen gas was introduced. When the pressure in the reaction chamber 201 was stabilized to 400 mtorr and when the temperature of the substrate 202 was stabilized to 250° C., 0.4 sccm of $SiH_4$ gas, 1 sccm of $PH_3/H_2$ gas, and 100 sccm of $H_2$ gas were introduced while adjusting the pressure in the reaction chamber 201 to 400 mtorr. A VHF electrical source of 105 MHz was used as the radiofrequency electrical source 209. VHF electrical power of 5 W was applied to the radiofrequency wave introducer 206 to generate plasma 210, while the shutter 211 was opened to start deposition of the n-type microcrystalline semiconductive layer 105 on the n-type amorphous semiconductive layer 104. When the thickness of the layer 105 reached 15 nm, the shutter 211 was closed and supply of the VHF electrical source 209 was suspended to quench the plasma 210. Supply of $SiH_4$ gas and $PH_3/H_2$ gas was suspended, whereas supply of hydrogen gas was continued for 2 minutes. The supply of hydrogen gas was also suspended, and then the reaction chamber 201 and the pipes 214 and 215 were evacuated to a pressure of $1 \times 10^{-5}$ torr.

(Formation of Crystal Nucleus-forming Layer) Next, 20 sccm of hydrogen gas was introduced. When the pressure in the reaction chamber 201 was stabilized to 100 mtorr and when the temperature of the heater 203 was stabilized to 480° C., the substrate was annealed for 30 minutes to form a crystal nucleus-forming layer 110. The temperature of the heater 203 was set to 220° C. and supply of hydrogen gas into the reaction chamber 201 was continued for 2 minutes. The supply of hydrogen gas was suspended, and then the reaction chamber 201 and the pipes 214 and 215 were evacuated to a pressure of $1 \times 10^{-5}$ torr.

(Formation of i-type Microcrystalline Semiconductive Layer)

Next, 500 sccm of hydrogen gas was introduced. When the pressure in the reaction chamber 201 was stabilized to 0.25 torr and when the temperature of the substrate 202 was stabilized to 220° C., $SiH_4$ gas was diluted to a concentration of ⅟20 or less with $H_2$ gas so that the retention time of the material gas was 40 msec or less in the deposition chamber, and 80 sccm of $SiH_4$ gas, and 2,400 sccm of $H_2$ gas were introduced while adjusting the pressure in the reaction chamber 201 to 0.25 torr. A VHF electrical source of 105 MHz was used as the radiofrequency electrical source 209. Electrical power of 200 W was applied to the radiofrequency wave introducer 206 to generate plasma 210, while the shutter 211 was opened to start deposition of the i-type microcrystalline semiconductive layer 106 on the crystal nucleus-forming layer 110. When the thickness of the layer 106 reached 1.5 nm, the shutter 211 was closed and supply of the VHF electrical source 209 was suspended to quench the plasma 210. Supply of $SiH_4$ gas was suspended, whereas supply of hydrogen gas was continued for 1 minutes. The supply of hydrogen gas was also suspended, and then the reaction chamber 201 and the pipes 214 and 215 were evacuated to a pressure of $1 \times 10^{-5}$ torr.

(Formation of p-type Semiconductive Layer)

Next, 500 sccm of hydrogen gas was introduced. When the pressure in the reaction chamber 201 was stabilized to 1.8 torr and when the temperature of the substrate 202 was stabilized to 180° C., 0.02 sccm of $SiH_4$ gas, 2 sccm of $BF_3/H_2$ gas, and 50 sccm of $H_2$ gas were introduced while adjusting the pressure in the reaction chamber 201 to 1.8 torr. A RF electrical source of 13.56 MHz was used as the radiofrequency electrical source 209. RF electrical power of 40 W was applied to the radiofrequency wave introducer 206 to generate plasma 210, while the shutter 211 was opened to start deposition of the p-type semiconductive layer 107 on the i-type microcrystalline semiconductive layer 106. When the thickness of the layer 107 reached 7 nm, the shutter 211 was closed and supply of the RF electrical source 209 was suspended to quench the plasma 210. Supply of $SiH_4$ gas and $BF_3/H_2$ gas was suspended, whereas supply of hydrogen gas was continued for 2 minutes. The supply of hydrogen gas was also suspended, and then the reaction chamber 201 and the pipes 214 and 215 were evacuated to a pressure of $1\times10^{-5}$ torr. The reaction chamber 201 was then released to atmospheric pressure.

Next, an ITO second transparent conductive layer 108 was formed on the p-type semiconductive layer 107 using a sputtering system not shown in the drawing. The target used was ITO ($In_2O_3+10\%\ SnO_2$), and 30 sccm of argon was introduced as a sputtering gas. DC power of 200 W was applied while heating the substrate to 200° C. to deposit an ITO layer 108 with a thickness of 70 nm.

A comb-like mask was placed onto the second transparent conductive layer 108 and a comb-like collecting electrode 109 composed of Cr (40 nm), Ag (1,000 nm), and Cr (40 nm) was formed by a vacuum evaporation process. A photovoltaic device in accordance with the present invention was thereby formed.

COMPARATIVE EXAMPLE 1

A photovoltaic device, which had the same configuration as that in Example 1, but did not have an n-type amorphous semiconductive layer 104, was produced as in Example 1.

COMPARATIVE EXAMPLE 2

A photovoltaic device, which had the same configuration as that in Example 1, but did not have an n-type microcrystalline semiconductive layer 105, was produced as in Example 1.

COMPARATIVE EXAMPLE 3

A photovoltaic device was produced as in Example 1, except that the n-type semiconductive layers 104 and 105 were not annealed and thus a crystal nucleus-forming layer 110 was not formed.

The photovoltaic devices of Example 1, and Comparative Examples 1 to 3 were subjected to measurement of initial photovoltaic conversion efficiency (photoelectromotive force/incident energy) and tests of photo-deterioration and vibrational deterioration, as follows.

Initial photovoltaic conversion efficiency: Each photovoltaic device was irradiated with light of AM-1.5 (100 mW/cm$^2$) and its V-I characteristic was measured.

Photo-deterioration: Each photovoltaic device was placed in an environment at a humidity of 50% and a temperature of 25° C. and irradiated with light of AM-1.5 for 800 hours. Its V-I characteristic was measured. The result was evaluated by a ratio of the photovoltaic conversion efficiency after photo-deterioration to the initial photovoltaic conversion efficiency.

Vibrational deterioration: Each photovoltaic device was placed in a dark chamber at a humidity of 60% and a temperature of 25° C. and vibrated at a vibration frequency of 60 Hz and an amplitude of 0.1 mm for 500 hours. Its V-I characteristic was measured. The result was evaluated by a ratio of the photovoltaic conversion efficiency after vibrational deterioration to the initial photovoltaic conversion efficiency.

These results are shown in Table 1.

TABLE 1

| | Conversion Efficiency | | | |
| --- | --- | --- | --- | --- |
| | Initial | After Photo-degradation | After Vibrational degradation | Evaluation |
| Example 1 | 1 | 1 | 1 | Good |
| Comparative Example 1 | 0.86 | 0.9 | 0.86 | Not good |
| Comparative Example 2 | 0.87 | 0.65 | 0.9 | Not good |
| Comparative Example 3 | 0.88 | 0.98 | 0.98 | Average |

Each efficiency value is normalized by the corresponding value of Example 1.

Table 1 demonstrates that the photovoltaic device in accordance with the present invention shows superior characteristics in the initial efficiency, the efficiency after photo-degradation, and the efficiency after vibrational degradation.

EXAMPLE 2

Figure 3:
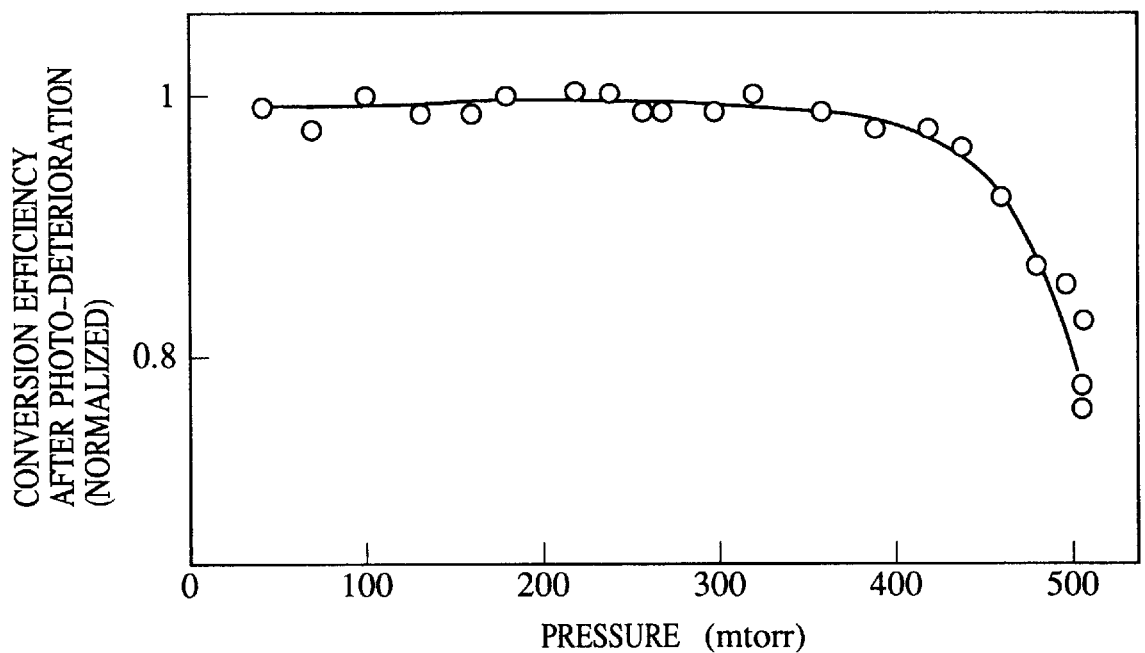
FIG. 3 is a graph showing the relationship between the pressure in the reaction chamber and the photovoltaic conversion efficiency after photo-degradation.

A series of photovoltaic devices were produced as in Example 1 while varying the pressure in the reaction chamber 201 during the formation of the i-type microcrystalline semiconductive layer 106, and subjected to the photo-degradation test as in Example 1. FIG. 3 is a graph showing the relationship between the pressure in the reaction chamber and the photovoltaic conversion efficiency after photo-degradation, in which the efficiency is normalized by the efficiency of the device in Example 1 after the photo-degradation. FIG. 3 demonstrates that it is preferable that the pressure in the reaction chamber during forming the i-type microcrystalline semiconductive layer 106 be 400 mtorr or less.

EXAMPLE 3

Figure 4:
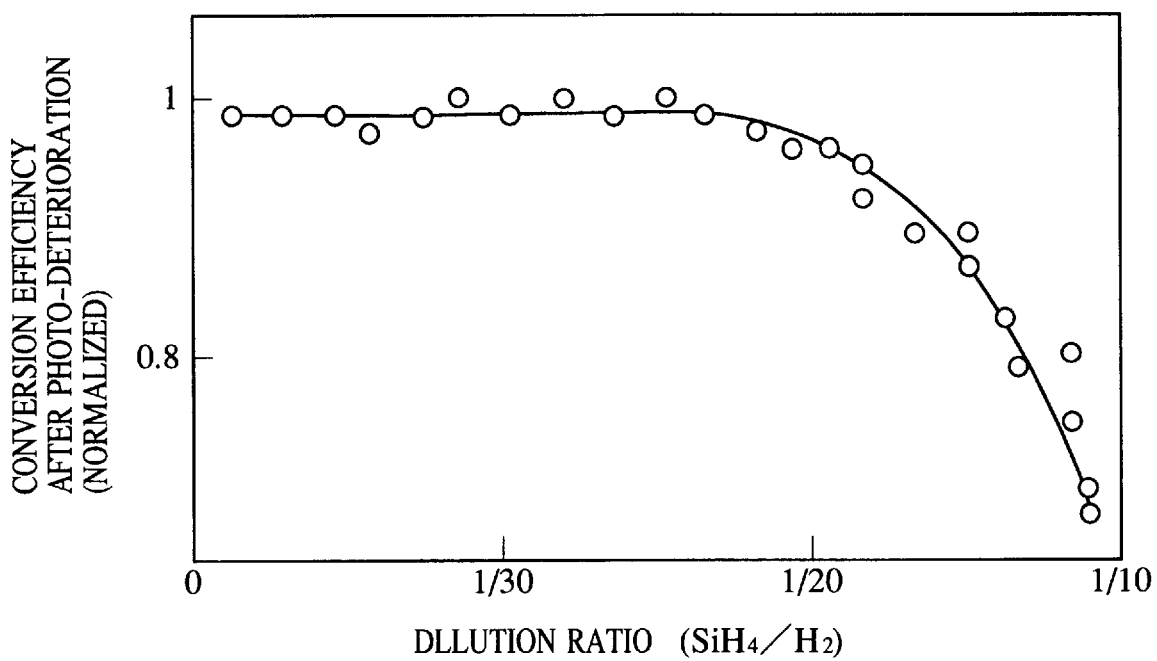
FIG. 4 is a graph showing the relationship between the dilution ratio and the photovoltaic conversion efficiency after photo-degradation.

A series of photovoltaic devices were produced as in Example 1 while varying the dilution ratio ($SiH_4/H_2$) of the $SiH_4$ gas to the $H_2$ gas during the formation of the i-type microcrystalline semiconductive layer 106, and subjected to the photo-degradation test as in Example 1. FIG. 4 is a graph showing the relationship between the dilution ratio and the photovoltaic conversion efficiency after photo-degradation, in which the efficiency is normalized by the efficiency of the device in Example 1 after the photo-degradation. FIG. 4 demonstrates that it is preferable that the dilution ratio of the silane gas to the hydrogen gas be 1/20 or less. The same results were confirmed from a diluent composed of a mixture of hydrogen and an inert gas.

EXAMPLE 4

Figure 5:
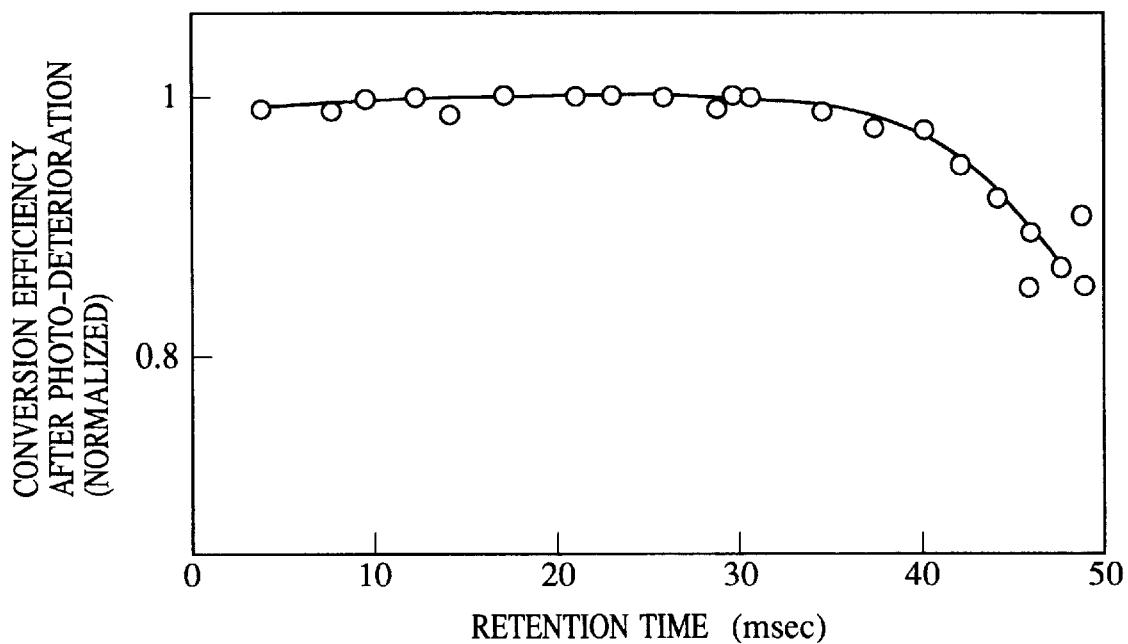
FIG. 5 is a graph showing the relationship between the retention time and the photovoltaic conversion efficiency after photo-degradation.

A series of photovoltaic devices were produced as in Example 1 while varying the retention time of the material gas ($SiH_4+H_2$) in the reaction chamber 201 during the formation of the i-type microcrystalline semiconductive layer 106, and subjected to the photo-degradation test as in Example 1. FIG. 5 is a graph showing the relationship between the retention time and the photovoltaic conversion efficiency after photo-degradation, in which the efficiency is normalized by the efficiency of the device in Example 1 after the photo-degradation. FIG. 5 demonstrates that it is preferable that the retention time of the material gas in the reaction chamber 201 be 40 msec or less.

EXAMPLE 5

Figure 6:
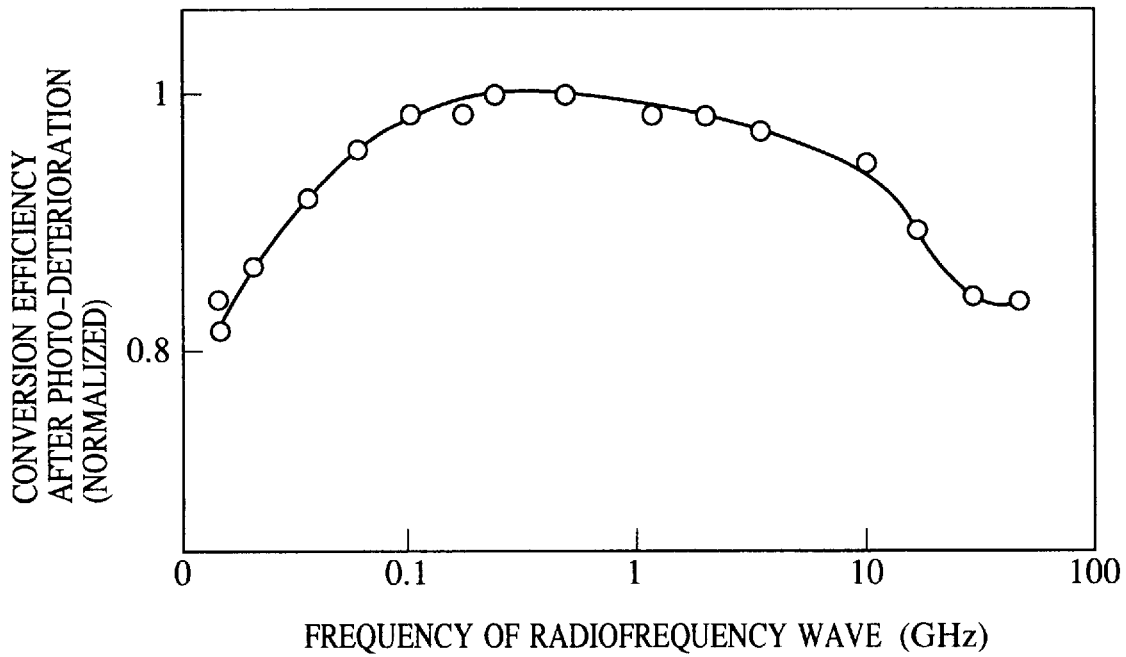
FIG. 6 is a graph showing the relationship between the frequency and the photovoltaic conversion efficiency after photo-degradation.

A series of photovoltaic devices were produced as in Example 1 while varying the frequency of the radiofrequency wave during the formation of the i-type microcrystalline semiconductive layer 106, and subjected to the photo-degradation test as in Example 1. FIG. 6 is a graph showing the relationship between the frequency and the photovoltaic conversion efficiency after photo-degradation, in which the efficiency is normalized by the efficiency of the device in Example 1 after the photo-degradation. FIG. 6 demonstrates that it is preferable that the frequency for forming the i-type microcrystalline semiconductive layer 106 be in a range of 0.1 GHz to 10 GHz.

EXAMPLE 6

Figure 7:
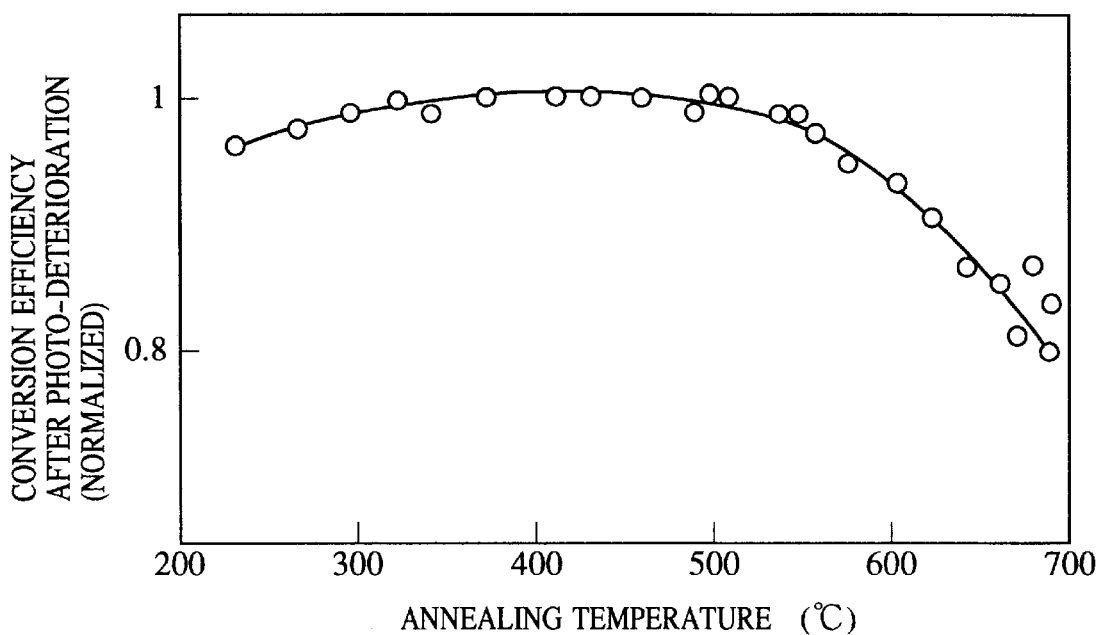
FIG. 7 is a graph showing the relationship between the annealing temperature and the photovoltaic conversion efficiency after photo-degradation.

A series of photovoltaic devices were produced as in Example 1 while varying the annealing temperature of the n-type semiconductive layers 104 and 105 for forming the crystal nucleus-forming layer 110, and subjected to the photo-degradation test as in Example 1. FIG. 7 is a graph showing the relationship between the annealing temperature and the photovoltaic conversion efficiency after photo-degradation, in which the efficiency is normalized by the efficiency of the device in Example 1 after the photo-degradation. FIG. 7 demonstrates that it is preferable that the annealing temperature be 550° C. or less.

EXAMPLE 7

Figure 8:
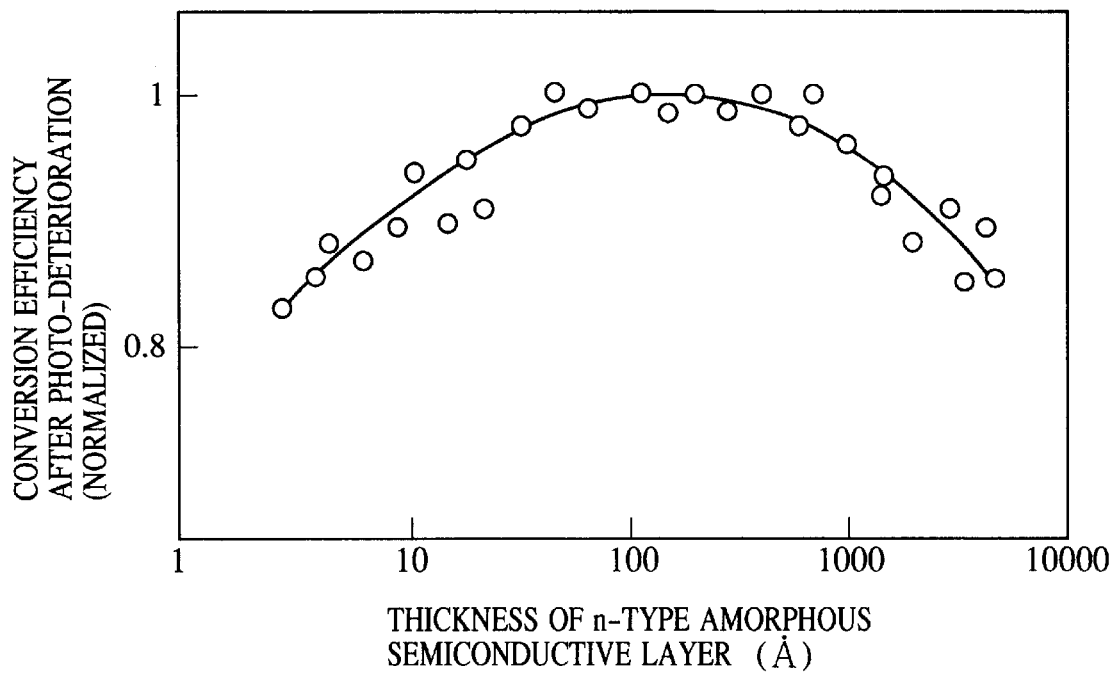
FIG. 8 is a graph showing the relationship between the thickness of an n-type amorphous semiconductive layer and the photovoltaic conversion efficiency after photo-degradation.
Figure 9:
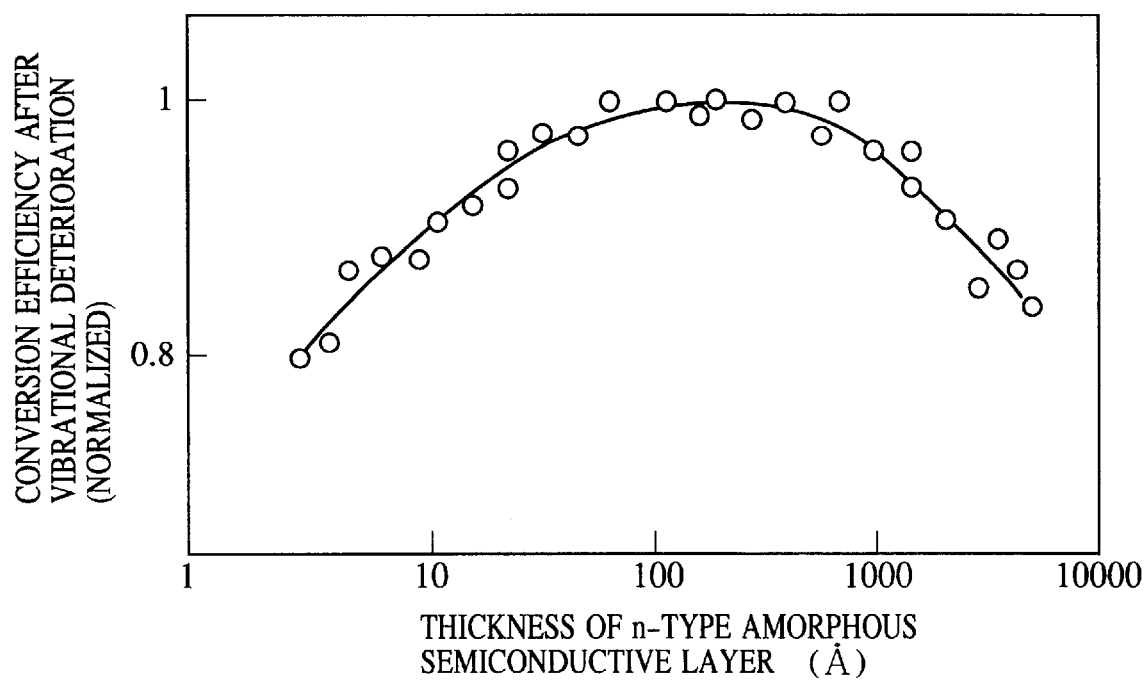
FIG. 9 is a graph showing the relationship between the thickness of an n-type amorphous semiconductive layer and the photovoltaic conversion efficiency after vibrational degradation.

A series of photovoltaic devices were produced as in Example 1 while varying the thickness of the n-type amorphous semiconductive layer 104, and subjected to the photo-degradation and vibrational degradation tests as in Example 1. FIGS. 8 and 9 are graphs showing the relationships between the thickness and the photovoltaic conversion efficiency after photo-degradation and vibrational degradation, respectively, in which the efficiency is normalized by the efficiency of the device in Example 1 after the photo-degradation. FIGS. 8 and 9 demonstrate that it is preferable that the thickness of the n-type amorphous semiconductive layer 104 be in a range of 50 Å to 1,000 Å.

EXAMPLE 8

Figure 10:
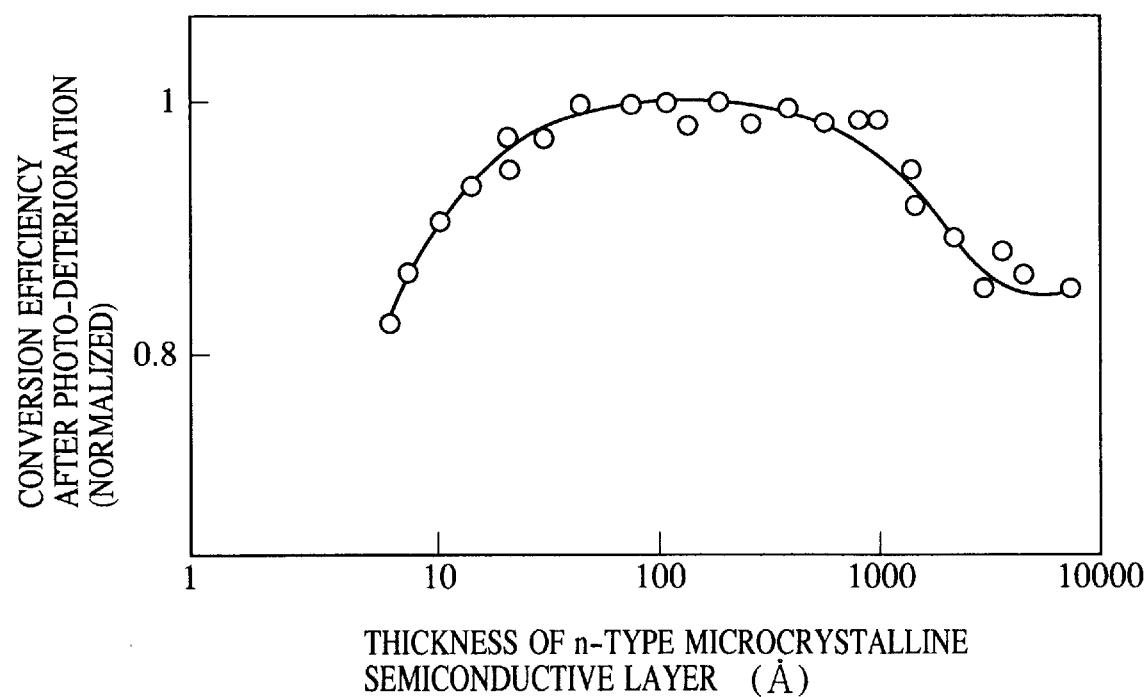
FIG. 10 is a graph showing the relationship between the thickness of an n-type microcrystalline semiconductive layer and the photovoltaic conversion efficiency after photo-degradation.
Figure 11:
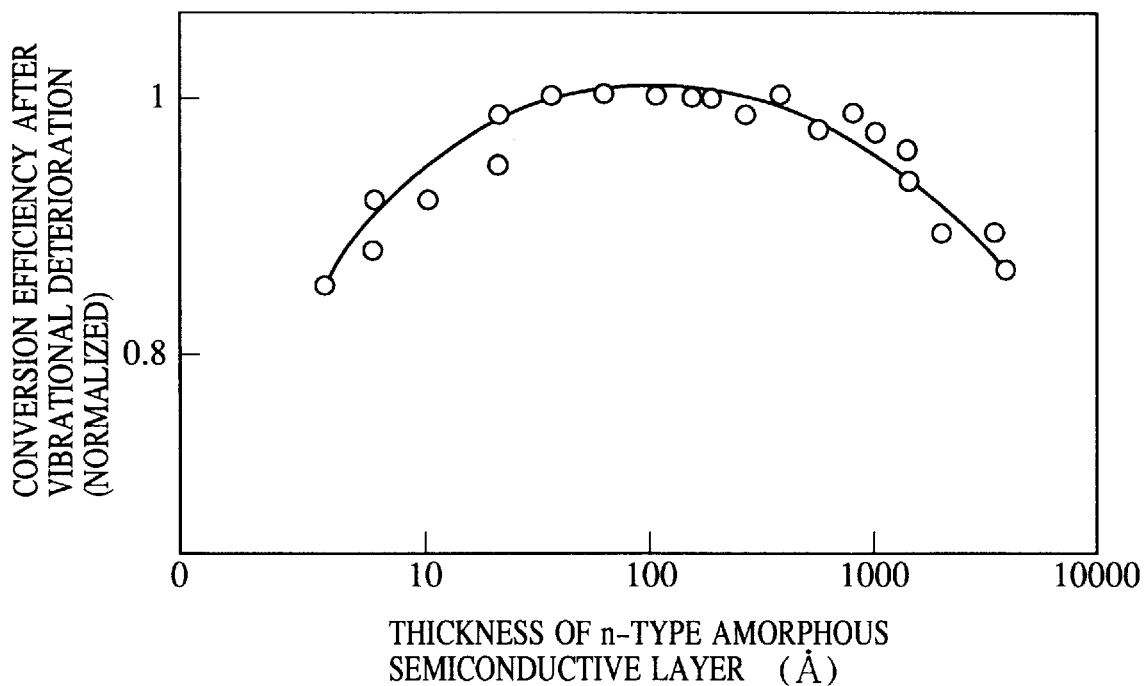
FIG. 11 is a graph showing the relationship between the thickness of an n-type microcrystalline semiconductive layer and the photovoltaic conversion efficiency after vibrational degradation.

A series of photovoltaic devices were produced as in Example 1 while varying the thickness of the n-type microcrystalline semiconductive layer 105, and subjected to the photo-degradation and vibrational degradation tests as in Example 1. FIGS. 10 and 11 are graphs showing the relationships between the thickness and the photovoltaic conversion efficiency after photo-degradation and vibrational degradation, respectively, in which the efficiency is normalized by the efficiency of the device in Example 1 after the photo-degradation. FIGS. 10 and 11 demonstrate that it is preferable that the thickness of the n-type microcrystalline semiconductive layer 105 be in a range of 50 Å to 1,000 Å.

EXAMPLE 9

Figure 12:
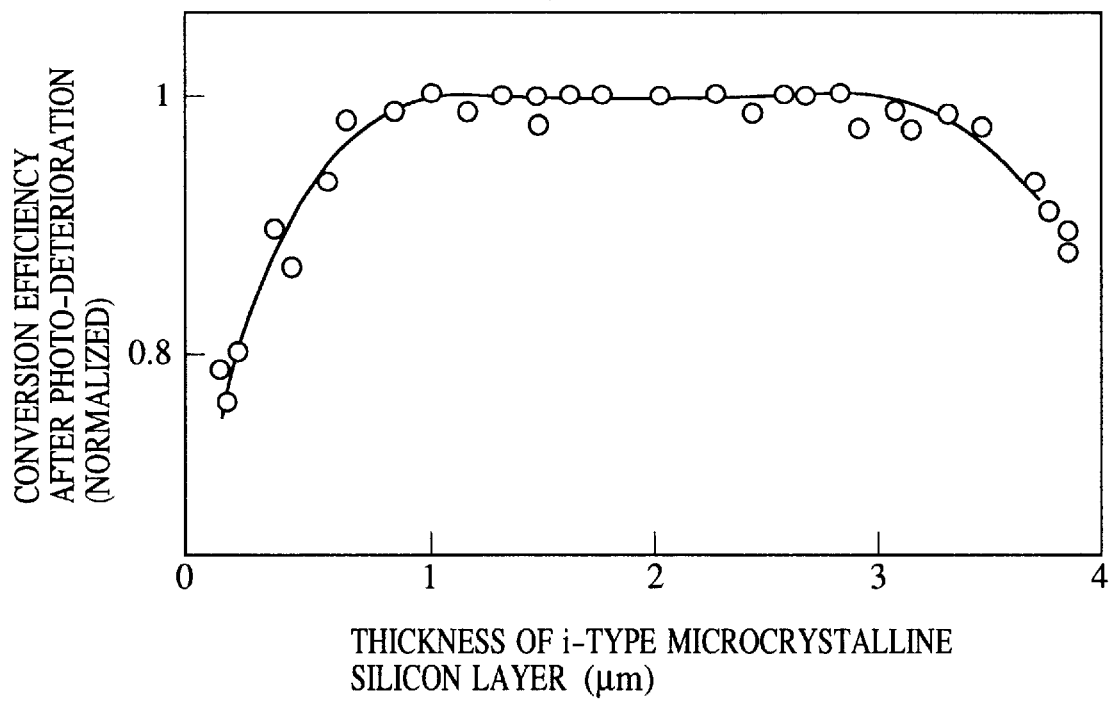
FIG. 12 is a graph showing the relationship between the thickness of an i-type microcrystalline semiconductive layer and the photovoltaic conversion efficiency after photo-degradation.

A series of photovoltaic devices were produced as in Example 1 while varying the thickness of the i-type microcrystalline semiconductive layer 106, and subjected to the photo-degradation test as in Example 1. FIG. 12 is a graph showing the relationship between the thickness and the photovoltaic conversion efficiency after photo-degradation, in which the efficiency is normalized by the efficiency of the device in Example 1 after the photo-degradation. FIG. 12 demonstrates that it is preferable that the thickness of the i-type microcrystalline semiconductive layer 106 be in a range of 0.5 $\mu$m to 3.5 $\mu$m.

EXAMPLE 10

A photovoltaic device was produced as in Example 1 except that the flow rate of the $H_2$ gas was changed to 2,000 sccm and 600 sccm of He gas was further supplied, and evaluated as in Example 1. The photovoltaic device had superior photovoltaic characteristics, which are similar to those of Example 1.

As described above, the thin-film microcrystalline semiconductive layer has high adhesiveness regardless of high-rate deposition of the layer in the production of the photovoltaic device in accordance with the present invention. The photovoltaic device has high photovoltaic conversion efficiency due to a large short-circuit current, a large release voltage, and a large fill factor. Further, the photovoltaic device has superior durability e.g. improved photo-degradation and vibrational degradation characteristics.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for making a photovoltaic device comprising:

a) forming on a supporting substrate a hydrogen-containing n-type silicon layer by depositing at least an n-type amorphous semiconductive layer and then an n-type microcrystalline semiconductive layer on said supporting substrate;

b) annealing the hydrogen-containing n-type silicon layer to provide a crystal nucleus-forming layer;

c) forming an i-type microcrystalline silicon semiconductive layer on the annealed hydrogen-containing n-type silicon layer; and d) forming a hydrogen-containing p-type silicon semiconductive layer on said i-type microcrystalline silicon semiconductive layer.

2. A method for making a photovoltaic device according to claim 1, further comprising a step of forming at least a first transparent conductive layer on the supporting substrate.

3. A method for making a photovoltaic device according to claim 2, further comprising a step of forming a second transparent conductive layer on the hydrogen-containing p-type silicon semiconductive layer.

4. A method for making a photovoltaic device according to claim 1, wherein the hydrogen-containing i-type microcrystalline silicon semiconductive layer is formed by a plasma enhanced CVD process using a silane material gas diluted to a concentration of 1/20 or less with a diluent gas comprising hydrogen or a mixture of hydrogen and an inert gas, wherein said CVD process is carried out in a deposition chamber under a deposition pressure of 400 mtorr or less, the silane material gas has a retention time in the deposition chamber of 40 msec or less, and a radiofrequency wave having a frequency of 0.1 GHz to 10 GHz is used.

5. A method for making a photovoltaic device according to claim 1, wherein the hydrogen-containing n-type silicon semiconductive layer is annealed at a temperature of 550° C. or less.

* * * * *

UNITED STATES PATENT AND TRADEMARK OFFICE
CERTIFICATE OF CORRECTION

PATENT NO.   : 6,268,233 B1
DATED        : July 31, 2001
INVENTOR(S)  : Masafumi Sano It is certified that error appears in the above-identified patent and that said Letters Patent is hereby corrected as shown below:

Drawings,
Figure 4, sheet 4, "DLLUTION RATIO" should read -- DILUTION RATIO --.

Column 1,
Line 23, "Junction" should read -- junction --.

Column 5,
Line 35, "conauctive" should read -- conductive --.

Column 10,
Line 17, "$1.0 \times 1.0^{-6}$ S/cm" should read -- $1.0 \times 10^{-6}$ S/cm --.

Column 11,
Line 3, "In" should read -- in --; and
Line 25, "crystal" should read -- crystals --.

Column 14,
"Layer)Next," should read -- Layer) ¶ Next, --.

Signed and Sealed this

Fifth Day of March, 2002

Attest:

JAMES E. ROGAN
Attesting Officer  Director of the United States Patent and Trademark Office